(12) United States Patent
Kühn et al.

(10) Patent No.: US 11,075,632 B2
(45) Date of Patent: Jul. 27, 2021

(54) DYNAMIC SENSOR FOR MEASUREMENT DEVICE

(71) Applicant: Pepperl+Fuchs GmbH, Mannheim (DE)

(72) Inventors: Thomas Kühn, Mannheim (DE); Jochen Vater, Lampertheim (DE); Christoph Braunsmann, Dackenheim (DE)

(73) Assignee: Pepperl + Fuchs GmbH, Mannheim (DE)

( * ) Notice: Subject to any disclaimer, the term of this patent is extended or adjusted under 35 U.S.C. 154(b) by 0 days.

(21) Appl. No.: 16/663,702

(22) Filed: Oct. 25, 2019

(65) Prior Publication Data

US 2020/0136617 A1 Apr. 30, 2020

(30) Foreign Application Priority Data

Oct. 25, 2018 (DE) ..................... 10 2018 126 648.0

(51) Int. Cl.
*G01N 27/00* (2006.01)
*G08B 19/00* (2006.01)
*G08B 21/00* (2006.01)
*G08B 23/00* (2006.01)
*H03K 17/95* (2006.01)
*H03K 17/955* (2006.01)

(52) U.S. Cl.
CPC ....... *H03K 17/9547* (2013.01); *H03K 17/955* (2013.01)

(58) Field of Classification Search
CPC ............. H03K 17/9547; H03K 17/955; H03K 2217/9401; H03K 17/9502; H03K 17/9532; H03K 17/9535

USPC .......................................................... 331/65
See application file for complete search history.

(56) References Cited

U.S. PATENT DOCUMENTS

| 2010/0225332 A1 | 9/2010 | Niwa et al. |
| 2014/0247040 A1 | 9/2014 | Reitsma et al. |
| 2016/0195598 A1 | 7/2016 | Reitsma |
| 2019/0115918 A1* | 4/2019 | Lotz ................... H03K 17/9502 |

FOREIGN PATENT DOCUMENTS

| FR | 2281578 | 5/1976 |
| WO | 2014138059 A1 | 9/2014 |

OTHER PUBLICATIONS

German Search Report from Patent Application 10 2018 126 648.0 dated Mar. 29, 2019.
European Search Report for EU Patent Application No. EP 19202660.7 dated Mar. 2, 2020.

* cited by examiner

*Primary Examiner* — Richard Tan
(74) *Attorney, Agent, or Firm* — Gregory L. Mayback; Dickinson Wright PLLC (57) ABSTRACT

An oscillating sensor device, particularly for a proximity sensor, for sensing a dynamic change of attenuation caused by a measurable physical effect includes an oscillator including a resonance circuit and an amplifier fed back to the resonance circuit and configured to maintain oscillation of the oscillator, and a control unit configured to control the open loop gain of the oscillator. The amplifier comprises a non-linear gain characteristics defining an operating point at a preset amplitude of oscillation. The control unit is configured to control the open loop gain of the oscillator so that the operating point is set to a preset amplitude of the oscillation.

15 Claims, 3 Drawing Sheets

DYNAMIC SENSOR FOR MEASUREMENT DEVICE

CROSS-REFERENCE TO RELATED APPLICATIONS

This application claims the priority, under 35 U.S.C. § 119(a)-(d), to German Patent Application No. 10 2018 126 648.0, filed Oct. 25, 2018; the prior applications are herewith incorporated by reference in their entirety.

STATEMENT REGARDING FEDERALLY SPONSORED RESEARCH OR DEVELOPMENT

Not Applicable

FIELD OF THE INVENTION

The present invention relates to dynamic sensors having an oscillator with a resonance circuit and an amplifier with a controllable loop gain. Particularly, the present invention relates to measures to increase sensitivity of the dynamic sensor in a reproducible manner.

BACKGROUND OF THE INVENTION

Dynamic sensors are generally used to detect a change of state caused by various physical effects. One example of dynamic sensors are inductive sensors wherein a change of impedance of a sensing coil in an oscillator can be detected by sensing a change of amplitude of a resulting oscillation. Particularly, such inductive sensors may be applied for proximity sensors where the movement of a conductive object within or through a sensing range shall be dynamically detected.

Inductive sensors often have an oscillator including a resonance circuit formed with a sensing coil providing the variable impedance. During operation the oscillator oscillates while the sensing coil produces an alternating magnetic field which is substantially affected by the presence of conductive objects. Therefore, conductive objects which enter or leave a sensing range of the sensing coil or move in or out of the sensing range produce a change of the effective impedance of the sensing coil.

During operation the resonance circuit of the oscillator has a resonance frequency which is determined by the inductance of the sensing coil and by the capacitance of the capacitor. By means of a feedback amplification, the resonance circuit is excited so that the oscillation is maintained by injecting energy in phase with the oscillation.

Further, the presence of an object in the sensing range leads to a decrease of a quality factor of the sensing coil caused by an energy loss due to the production of eddy currents in the object. In operation this results in a change of oscillation frequency of the excited oscillation and in a change of the amplitude of oscillation.

In applications where the movement of objects into a sensing range shall be detected often an amplitude variation is analyzed. Therefore, the characteristics of the feedback amplification is usually configured to obtain a high sensitivity of the amplitude with respect to a change of resonance characteristics due to the presence of an object in the sensing range.

Further, for obtaining a high sensitivity of the oscillating sensor the dependency between the change of impedance and the amplitude of oscillation shall be high. The characteristics of the open loop gain of the oscillator is therefore usually made linear providing an almost constant gain in the operation point for normal operation to ensure a high sensitivity for dynamic attenuation.

However, if the open loop gain characteristics of the oscillator is too flat (constant amplification), the recovery time to bring the oscillation back to the operating point after a substantial attenuation, may be too long for a given application. Therefore, in a detuned operation mode, which may e.g. occur during a start-up phase of the inductive sensor or when an object which provides a high attenuation of the resonance circuit leaves the sensing range, the oscillator needs to provide a high open loop gain to quickly bring the operation back to the operating point with a stable oscillation. Also, in case of loop gain characteristics with a too flat amplification, there might be no fixed operating point for unattenuated condition so that in steady state operation no stable operating point is reached.

Adapting gain characteristics of amplifiers is well known in the art. Usually, a gain stage is therefore provided with corresponding characteristics based on a preferred operating point to ensure a high sensitivity of detection for an object entering the sensing range. For instance, non-linear semiconductor effects may be used to form the gain characteristics. However, using semiconductor effects for forming the gain characteristics introduces a high temperature dependency and suffer from a low reproducibility so that the application in inductive sensors, such as proximity sensors, is not appropriate. Furthermore, those non-linear gain characteristics based on semiconductor effects cannot be easily tuned.

Substantially, the gain characteristics can only be defined with respect to an assumed operating point. In different environments and depending on the presence of other conductive objects in the sensing range this operating point may vary and decreases the range of high sensitivity regarding objects entering the sensing range.

An oscillating sensor and a measurement device are provided which substantially have a high sensitivity with respect to objects entering a sensing range, a high signal-to-noise ratio, a high adaptability towards differing environmental and component tolerances.

SUMMARY OF THE INVENTION

The oscillating sensor device provides the measurement device and the proximity sensor device, and a method for operating an oscillating sensor device is provided.

According to a first aspect, an oscillating sensor device, particularly for a proximity sensor, for sensing a dynamic change of attenuation caused by a measurable physical effect is provided, comprising:
  an oscillator including a resonance circuit and an amplifier fed back to the resonance circuit and configured to maintain oscillation of the oscillator wherein the amplifier comprises a non-linear gain characteristics defining an operating point at a preset amplitude of oscillation, and
  a control unit configured to control the open loop gain of the oscillator;
wherein the control unit is configured to control the open loop gain of the oscillator so that the operating point is set to a preset amplitude of the oscillation.

The above oscillating sensor device substantially has an oscillator including a resonance circuit and an amplifier. In the resonance circuit at least one of the components may act as a sensing element. In operation, the resonance circuit produces an oscillation depending on the variable value of the at least one sensing element.

Herein, the term "open loop" defines a cut-off of the feedback connection from an output of the amplifier and the resonance circuit to the input of the amplifier which serves as a model for characterization of the oscillator. The open loop gain is defined as the gain resulting from a ratio of the voltage amplitude of the oscillation at the resonance circuit and a variable amplitude at the amplifier input for an open loop condition.

For instance, in case of an inductive sensor, the resonance circuit has a sensing coil. Conductive objects entering the sensing range of the sensing coil will reduce the energy of the oscillation in the resonance circuit (quality factor) due to the generation of eddy currents in the objects, thereby providing an attenuation and reducing the amplitude of oscillation.

The amplifier amplifies the oscillator signal at an output of the resonance circuit by a feedback coupling of the amplified oscillation signal. So, the amplifier is appropriately fed back to the resonance circuit to compensate an energy loss due to an attenuation caused by parasitic effects and by influences of detectable effects to be sensed, such as objects in the sensing range of the inductive sensor. The amplifier is therefore configured to inject energy into the resonance circuit so that for each attenuation a specific oscillation with an amplitude and frequency characteristic for the attenuation is set. By applying a near to constant amplification at the operating point, the oscillation amplitude is made strongly depending on the attenuation of the oscillation, i.e., for an inductive sensor, on the quality factor of the sensing coil affected by an object entering the sensing range.

As mentioned above, for a reliable and stable operation of the oscillating sensor it is preferred that the open loop gain characteristics (open loop gain versus input voltage in open loop state) of the oscillator needs to be shaped. Usually, it is provided an open loop gain characteristics which has a substantial constant or slightly declining gain in and around a predefined operating point (given by a preset amplitude) and a high gradient of the open loop gain for the oscillator being strongly detuned from the constant gain range.

The above oscillating sensor device allows to adapt the open loop gain by means of the control unit so that in every environment where the oscillating sensor device is applied, an operating point can be set. The operating point can therefore be selected to ensure a high or the highest possible sensitivity with respect to a detection of a change of amplitude of oscillation. The operating point can be set by predefining a preset amplitude which is used as a reference for adjustment of the open loop gain.

A further advantage of the oscillating sensor device is that the oscillating sensor device automatically adjusts to the specific use case so that in the application field, no further adjustment is necessary.

Moreover, the dynamic of adapting the open loop gain may be set lower than the dynamic of change of attenuation due to an object to be detected.

According to an embodiment, the amplifier may have a gain stage which is feedback coupled with the resonance circuit by means of a feedback circuit including a variable resistance to be controlled by the control unit in order to control the open loop gain of the oscillator, wherein particularly the feedback coupling is provided by a trimming resistor with a fixed resistance and a controllable switch so that an effective variable resistance is set by controlling the switch with a modulated control signal.

Alternatively or additionally, the amplifier may have a gain stage, wherein the control unit is configured to control the gain of the gain stage in order to control the open loop gain of the oscillator, wherein particularly the gain stage is configured as a voltage controlled gain stage to be controlled by a voltage control signal provided by the control unit or the gain stage includes an internal feedback to be controlled by a PWM control signal provided by the control unit.

Furthermore, the control unit comprises an amplitude determination unit for determining a current amplitude value of the oscillation amplitude, a control deviation unit for determining an amplitude deviation between the preset amplitude and the current amplitude value and a controlling block for implementing a control with an integration portion to provide a control signal for controlling the open loop gain of the oscillator.

The controlling block of the control unit may be configured to provide an integration portion with a first integration factor.

The controlling block of the control unit may be configured to provide the integration portion with the first integration factor in case of a positive amplitude deviation between a preset amplitude and a current amplitude of oscillation and with a second integration factor for a negative amplitude deviation, wherein the first integration factor and the second integration factor are different.

Further, the control unit may be configured to provide a proportional and/or a differential portion for either the positive or the negative amplitude deviation.

According to another embodiment, the control unit may be configured to adjust the open loop gain of the oscillator so that the oscillation amplitude corresponds to the preset amplitude after a first time after a positive amplitude deviation larger than a given first amplitude deviation threshold has been detected.

Particularly, the control unit may be configured to adjust the open loop gain so that the oscillation amplitude corresponds to the preset amplitude after a second time after a negative amplitude deviation larger than a given second amplitude deviation threshold has been detected, wherein the second time is shorter than the first time and wherein the first amplitude deviation threshold is equal, higher or lower than the second amplitude deviation threshold.

Furthermore, an analyzing unit may be configured to receive the amplitude deviation and to derive a sensor signal therefrom.

Particularly, a frequency determination unit may be provided which is configured to determine an oscillation frequency shift caused by a dynamic object, wherein the analyzing unit is configured to receive the oscillation frequency and to determine a kind of dynamic object by the amplitude deviation and by the frequency shift determined.

According to a further aspect a method for operating an oscillating sensor, particularly for a proximity sensor, for sensing a dynamic change of attenuation caused by a measurable physical effect is provided, wherein the oscillation sensor comprises:
- an oscillator with a resonance circuit;
- an amplifier fed back to the resonance circuit and configured to maintain oscillation wherein the amplifier comprises a non-linear gain characteristics defining an operating point at a preset amplitude of oscillation, wherein the open loop gain is adjusted so that the operating point is set to a preset amplitude of the oscillation.

BRIEF DESCRIPTION OF THE DRAWINGS

Embodiments are described in more detail in conjunction with the accompanying drawings in which.

DETAILED DESCRIPTION OF THE EMBODIMENTS

Figure 1:
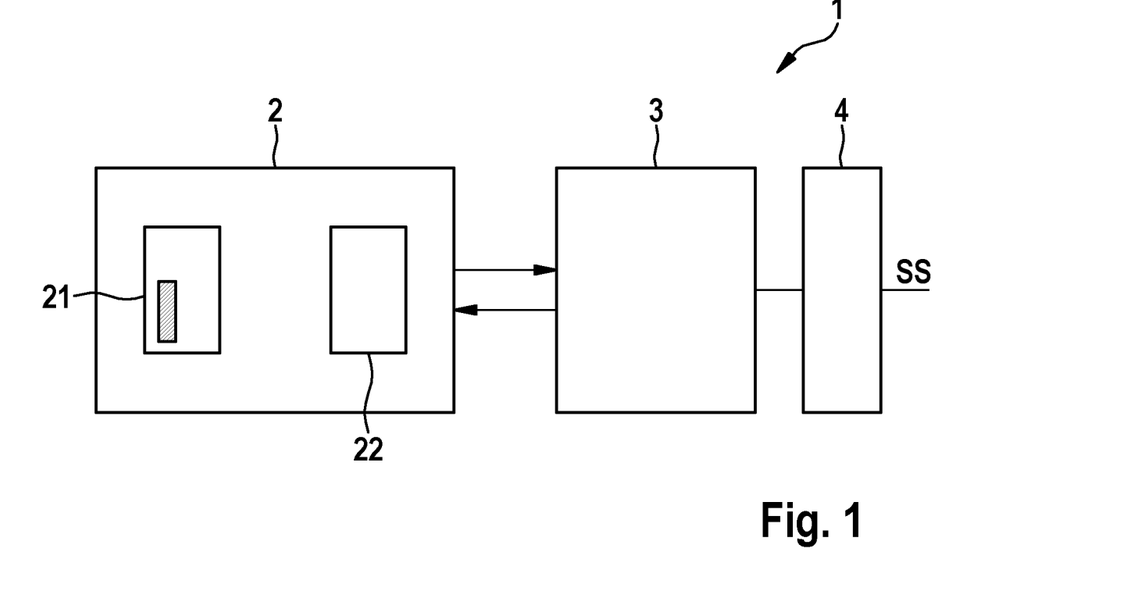
FIG. 1 shows a schematic view of a proximity sensor including an inductive sensor.

FIG. 1 schematically shows a measurement device 1 with an oscillating sensor device 2. In the present embodiment the oscillating sensor device 2 may be part of a proximity sensor for detecting the entering of a conductive object into a sensing range of the oscillating sensor device 2. In the following, the invention is described in the context of a proximity sensor. However, the inventive ideas can be applied to any measurement devices using oscillating sensors by which changes of a physical situation shall be detected.

The oscillating sensor 2 has a resonance circuit 21 and an amplifier 22. The resonance circuit 21 has an inductor 211 which may be provided as a sensing coil. In operation, the resonance circuit 21 oscillates and generates an alternating magnetic field in a sensing range around the sensing coil. The alternating magnetic field is affected by any conductive objects being present or moving through the sensing range. This is caused by eddy currents which are induced in the conductive objects in the sensing range so that energy is withdrawn from the resonance circuit 21. This energy loss effects in a change of impedance of the sensing coil and in an attenuation of the oscillation (decrease of resonant impedance). The attenuation is compensated by a feedback from the amplifier 22 which injects the amount of withdrawn energy being lost due to attenuation. Due to the changed attenuation of the resonance circuit 21, the amplitude of oscillation may vary depending on the presence or non-presence of a conductive object in the sensing range.

Figure 2:
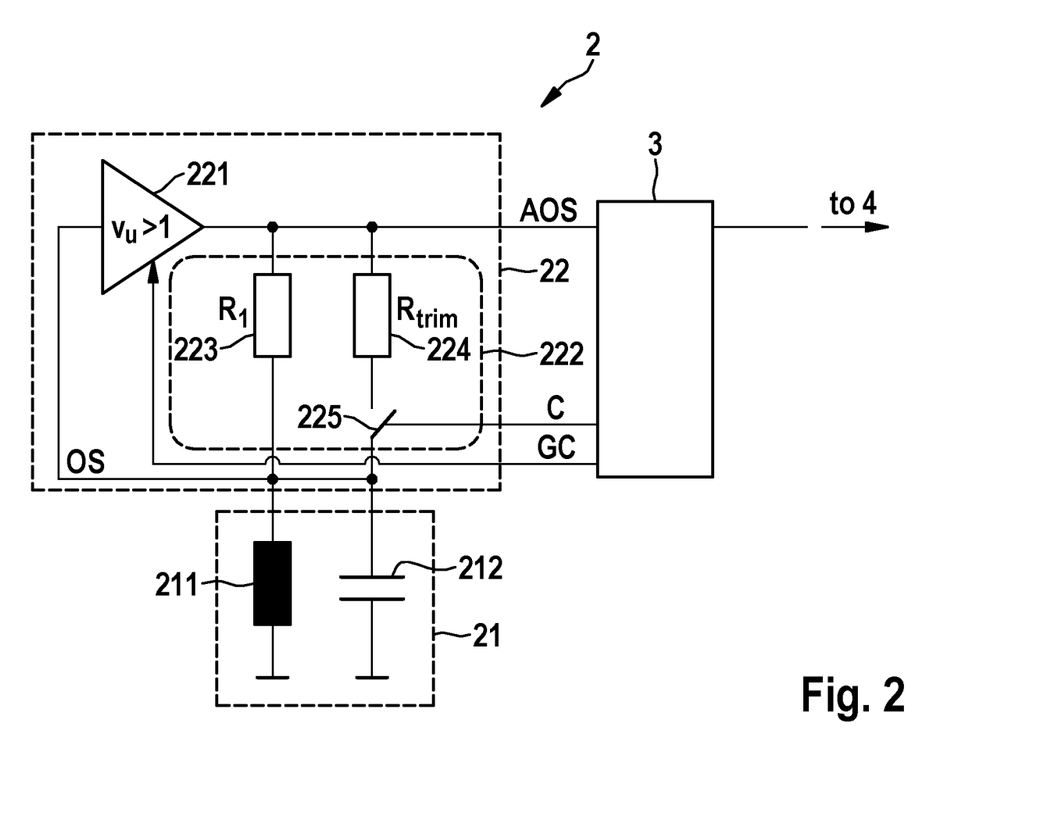
FIG. 2 shows an example of an oscillating sensor with a variable loop gain.

In FIG. 2, an example of the oscillating sensor 2 is shown in more detail. The resonance circuit 21 is formed with the sensing coil 211 and a capacitor 212 while the amplifier 22 has a gain stage 221. A feedback circuit 222 is provided to couple the output of the gain stage 221 with the resonance circuit 21. The gain stage 221 provides a gain of larger than 1. The feedback circuit 222 in combination with the resonance circuit 21 have a gain of smaller than 1. At the operating point of the oscillator, the open loop gain of gain stage 221, feedback circuit 222 and resonance circuit 21 is exactly 1, according to the characteristics as shown in more detail in conjunction with FIG. 3.

The feedback circuit 222 comprises a setup resistor 223 with a resistance of R1 and a trimming resistor 224 with a fixed resistance of $R_{trim}$ which is in series with a control switch 225. The control switch 225 may be implemented as any kind of electronic switch such as a MOSFET transistor or bipolar transistor.

The trimming resistor 224 and the control switch 225 act together as a calibration resistor to control the open loop gain of the oscillator by setting the feedback coupling between the gain stage 221 and the resonance circuit 21. The gain of the gain stage 221 may be controlled by a feedback control signal C which may be e.g. serve for modulated switching of the control switch 225. Furthermore, additionally or alternatively the open loop gain can be controlled by setting the gain of the gain stage 221. The gain of the gain stage 221 may be controlled by a gain control signal GC. The feedback control signal C and/or the gain control signal GC can be provided by a control unit 3.

The feedback control signal C serves for controlling the switch 225 to open or to close. By controlling the control switch 225, the effective resistance of the calibration resistor can be controlled. To vary the effective resistance of the calibration resistor 224, the control switch 225 is controlled by a pulse width modulation signal having a cycle frequency and a duty cycle.

The cycle frequency is determined by a cycle time which is defined as a total period including a first time in which the control switch 225 is closed and a second time in which the control switch 225 is open. The duty cycle indicates a ratio of the first time in which the control switch 225 is closed by the cycle time. The control with a pulse width modulated control signal results in an effective resistance of the trimming resistor 224 determined as a quotient of the resistance of the trimming resistor 224 and the duty cycle.

The adjustment/calibration is made by determining an appropriate duty cycle to set the effective resistance of the calibration resistor.

The control unit 3 provides the feedback control signal C for controlling the effective resistance of the calibration resistor, i.e. for adjusting the feedback coupling and thus the operating point of the oscillating sensor device 2 depending on the oscillation amplitude.

Furthermore, the control unit 3 may alternatively or additionally control the open loop gain by setting the gain of the gain stage 221 in order to control the open loop gain of the oscillator, wherein particularly the gain stage 221 is configured as a voltage controlled gain stage to be controlled by a voltage gain control signal provided by the control unit 3 or the gain stage 221 includes an internal feedback to be controlled by a PWM gain control signal provided by the control unit 3.

In general, such an oscillating sensor device 2 is initially calibrated or adjusted by setting the effective open loop gain of the arrangement of the gain stage 221, the feedback circuit 222 and the resonance circuit 21. However, for an oscillating sensor which substantially shall detect a change of the state of a system, the operating point may vary depending on the environmental influences on the oscillating sensor device 2 and the general setup of the oscillating sensor device 2. In case of an inductive sensor, the environment can be built up by the presence of conductive objects and installments which substantially determine or influence the operating point. Furthermore, component variations and tolerances may affect the operating point as well.

While by regular calibration cycles of the open loop gain of the oscillating sensor device 2 over lifetime, a long-termed variation of the operating point can be adjusted, more short-termed influences on the operating point, such as placing a conductive object in the sensing range of an inductive sensor, are usually not considered by the initial calibration or adjustment of the oscillating sensor device 2. The adjusting of the long termed variation of the operating point includes the adjustment of quasi-static influences such as aging, component tolerances, changes of installment, temperature and the like.

A shift of the operating point due to differing influences on the oscillating sensor device 2 may result in a reduced sensitivity since the change of the oscillation amplitude for equal changes of attenuations of the oscillation decreases.

This effect is caused by the gain characteristics of the amplifier 22 which will have different ranges of gain characteristics.

Figure 3:
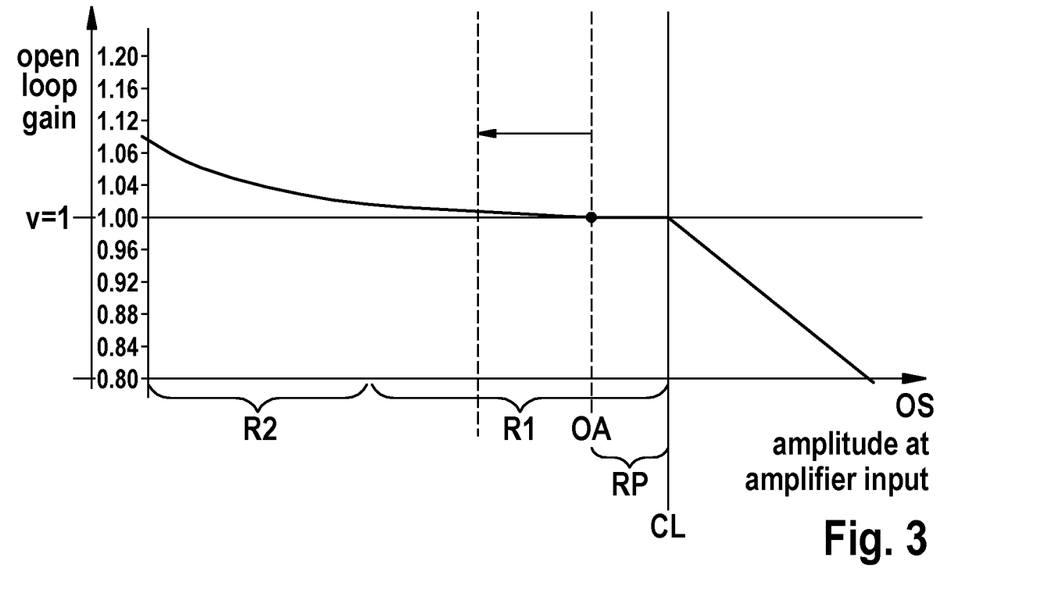
FIG. 3 shows an open loop gain characteristics of the oscillator.

FIG. 3 shows a diagram illustrating an open loop gain characteristics indicating the open loop gain of the oscillator for input signals of different amplitudes for an exemplary adjustment of the resonant circuit 21. In other words, the diagram shows the characteristics of the ratio of the voltage amplitude of the oscillation at the resonance circuit 21 and a variable amplitude at the amplifier input over the amplitude at the amplifier input. It can be seen that there is a quasi-linear operating range R1 (substantially horizontal part with only a slight decline) in which a substantially constant open loop gain is present. Substantially constant open loop gain may include a slight slope of the amplification needed or sufficient to ensure a stable operating point. The diagram shows a curve illustrating the open loop gain characteristics. For low amplitudes (amplitude range R2) being a result of high attenuation the open loop gain is made substantially higher than 1 to bring oscillation amplitude back into range R1.

To adapt the oscillation sensor device 2 to different environmental conditions (preset attenuations), it is hereby proposed to control the loop gain of the oscillator to have an operating point at which an optimized sensitivity towards a change of attenuation can be obtained.

For the exemplary inductive sensor, this allows to get a high sensitivity with respect to an object to be detected entering the sensing range of the oscillating sensor device 2. This is achieved by permanently adjusting the open loop gain so that the amplitude of oscillation is slowly brought back to a preset amplitude. The preset amplitude may be predetermined as an amplitude which can be achieved by the mutual operation of the resonance circuit 21 and the amplifier 22 for different environmental conditions which may occur.

In view of the diagram of FIG. 3 there is a clipping limit above which the amplifier 22 is in saturation. This is shown in the diagram by the abrupt decline of the open loop gain at oscillation amplitude at point CL. The preset amplitude PA may be selected from a range RP which has its upper limit at the clipping limit CL of the amplifier characteristics. The lower limit of the range RP can be defined depending on the clipping limit CL such as about 90% to 100% of the oscillation amplitude at the clipping limit. Preferably, the preset amplitude may be selected depending on the clipping limit CL of the oscillation amplitude, preferably between 2% and 10% lower than the clipping limit CL, more preferably between 2% and 5% lower than the clipping limit CL.

To bring the operating point to the preset amplitude, a control mechanism is applied which adjusts the loop gain so that a deviation between the preset amplitude and the current amplitude is minimized. This allows to permanently adapt the operating point to the present situation of the oscillating sensor 2 so that a short-term change of the attenuation of the oscillating sensor 2 is detected with a high sensitivity.

To adjust the loop gain of the oscillating sensor 2, the control mechanism of the measurement device 1 is implemented in the control unit 3.

Moreover, by means of an analyzing unit 4 a sensor signal SS is generated depending on the amplitude of the oscillation signal of the oscillating sensor 2.

The amplitude control of the oscillating sensor 2 is made slow so that the control deviation is minimized or eliminated much slower than a change of attenuation occurs when an object to be detected may enter the sensing range.

Figure 4:
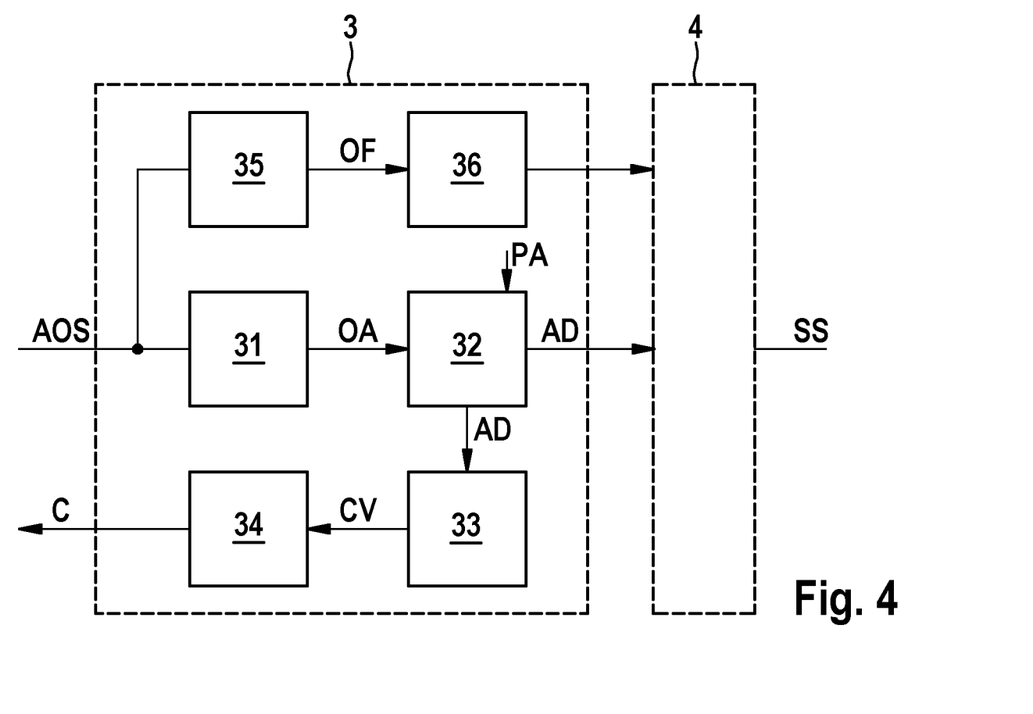
FIG. 4 schematically shows a block diagram of the control unit in more detail.

In FIG. 4 an exemplary configuration of the control unit 3 is shown in more detail.

An amplified oscillation signal AOS as an output of the gain stage 221 is fed to an amplitude determination unit 31. The amplitude determination unit 31 determines the current value of the oscillation amplitude. This may be carried out by the sampling of the oscillation by means of an analog-digital converter to determine the current oscillation amplitude. However, in other embodiments, the amplified oscillation signal AOS can be analyzed in an analog manner. For instance, the amplified oscillation signal AOS may be rectified by means of an analog rectification unit wherein the rectified signal is smoothed (e.g. by a low pass filter, capacitor or the like) and the smoothed signal is converted by an analog-digital converter to obtain the current oscillation amplitude value.

The current oscillation amplitude value OA is supplied to a control deviation unit 32 to obtain an indication of a difference between the current oscillation amplitude value OA and a preset amplitude value PA to obtain an amplitude deviation. The preset amplitude value PA shall be set as a fixed value which shall not be changed during operation of the measurement device 1.

The amplitude deviation value AD is supplied to a controlling block 33 which provides a control value CV by which the loop gain may be controlled. For instance, the control value CV may be converted to a pulse width modulated signal with a duty cycle which may correspond to or may depend on the control value CV in a PWM block 34. The pulse width modulated signal corresponds to the feedback control signal C wherein the feedback control signal C may be applied to the control switch 225 to set the effective resistance of the trimming resistor 224 in the embodiment of FIG. 3. In other embodiments a gain control signal GC can be directly applied to the gain stage 221 to control the gain of the gain stage 221 directly. This may apply to cases where the feedback circuit 222 cannot be trimmed.

By the control, the loop gain of the oscillating sensor device 2 is adjusted so that in a static state a preset amplitude of the oscillation is set defining an operating point. Once the oscillation of the resonance circuit 21 is affected by a conductive object which enters the sensing range, the energy loss of the resonance circuit 21 increases attenuation so that the amplitude of the resonance circuit 21 decreases. As the oscillating sensor device 2 had been adjusted to an optimized operating point, a high sensitivity against the object to be detected can be maintained.

The change of attenuation caused by the dynamic movement of the object results in an amplitude deviation from the preset amplitude which can be analyzed and used to derive the sensor signal therefrom. The amplitude deviation caused by a dynamic object has a much higher gradient than the slow amplitude deviation caused by static influences such as aging, tolerances, changes of installment and the like. Therefore, the adaptation of the open loop gain shall be carried out much slower, i.e. with a much lower gradient, than the effect of the dynamic object.

The controlling block 33 preferably has an integration portion with a low integration factor to slowly readjust the loop gain when a change of the general setup or installment of the oscillation sensor device 2 occurs. This allows that objects suddenly appearing in the sensing range can be detected, while the slow adjusting of the loop gain is not related to an object to be sensed. In the present embodiment, the control of the loop gain is made by controlling the control switch 225 so that the effective resistance of the trimming resistor 224 may be adjusted by the feedback control signal C.

The controlling block 33 may have different control behaviors for a positive or negative amplitude deviation AD. As the control mechanism shall enable to detect an object to be sensed by means of the amplitude deviation, a positive control deviation (preset amplitude is larger than the current amplitude value) shall be equalized slowly to adjust the oscillation amplitude towards the preset amplitude in a time regime which allows detecting conductive objects appearing in or entering the sensing range with a given minimum speed. The minimum speed corresponds to a speed which results in a change of attenuation which cannot be directly compensated by the integration portion of the control. Such a control behavior can be sufficiently achieved by setting an integration portion of the control mechanism of the controlling block 33. For such a case no proportional and/or differential portions of the control are required.

However, in order to bring the oscillating sensor device 2 to the operating point after an object has left the sensing range, a quicker intervention of the control mechanism into the loop gain can be provided. This can be achieved by providing the integration portion of the control with a higher integration factor for negative amplitude deviations (preset amplitude smaller than the current amplitude value) to reduce the overshoot of the current amplitude value when the objects leave the sensor range. This allows that the control has a stronger impact on negative amplitude deviations than for positive amplitude deviations. For negative amplitude deviations, a selective use of a proportional portion and a differential portion of the control unit might be applied. This can be achieved by adapting the control parameters such as the integration factor, the proportional factor and the differential factor depending on the amplitude deviation, particularly on the sign of the amplitude deviation.

As after an object entered the sensing range the amplitude deviation slowly approaches the preset amplitude it is preferred that the analyzing unit 4 derives the sensor signal SS from the amplitude deviation AD to obtain a high sensitivity against dynamic changes of the state of the oscillating sensor 2.

As another embodiment the control unit 3 may adjust the open loop gain to bring back oscillation amplitude to the preset amplitude after a first time after a positive amplitude deviation larger than a given first amplitude deviation threshold has been detected. The control unit may be further configured to adjust the open loop gain to bring back the oscillation amplitude to the preset amplitude after a second time after a negative amplitude deviation larger than a given second amplitude deviation threshold has been detected. The second time may be selected to be shorter than the first time and wherein the first amplitude deviation threshold may be equal, higher or lower than the second amplitude deviation threshold.

Furthermore, a frequency determination unit 35 may be applied to determine the oscillation frequency OF. A measurement of the frequency can be carried out by a timer periphery of a microcontroller or any other kinds of frequency counter. The oscillation frequency OF may be high-pass filtered in a filter unit 36 whose output is supplied to the analyzing unit 4 where a change of oscillation frequency may be detected.

The use of the filter unit 36 is advantageous as the temperature drift of the components is much higher than the frequency shifts resulting from an object entering the sensing range.

Depending on the amplitude deviation AD and the frequency shift, the analyzing unit 4 may determine the kind of dynamic object entering the sensing range, as differing conductivities and differing sizes of dynamic objects lead to different classes of frequency shifts and amplitude deviations. An assignment of the kind of the dynamic object to be sensed can be made by a lookup table assigning ranges of frequency shifts and ranges of amplitude deviations to a specific kind of object.

Figure 5:
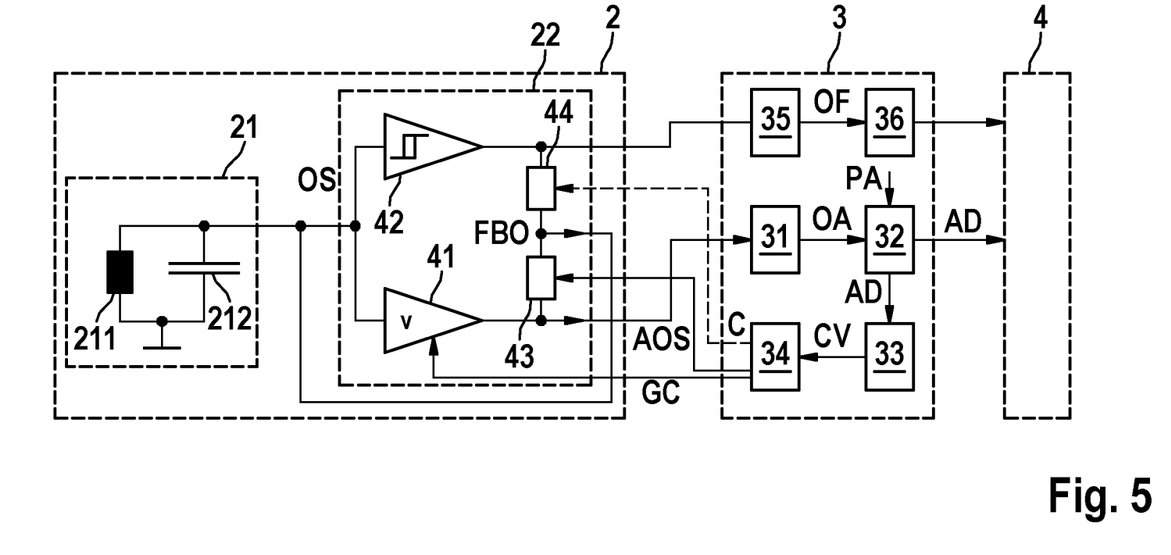
FIG. 5 an embodiment of the oscillating sensor device to provide a gain characteristic as shown in FIG. 2.

As shown in an embodiment of FIG. 5, the amplifier 22 may have a first gain stage 41 providing a substantial constant gain and the second gain stage 42 providing a high gain. This configuration allows shaping the gain characteristics as described above. If the first gain stage 31 is dominant with respect to the second gain stage 32, the respective gain may be between 1.25 and 8, more preferred between 1.5 and 4, for instance about 2, as the voltage divider network has a gain of about 0.5 in resonance for maximum sensitivity. The gain of the second gain stage 32 in the non-saturated operation range can be more than 1000.

The first gain stage 41 is substantially implemented as a linear amplifier which can be build using an operation amplifier or the like. The output of the first gain stage 31 is coupled via a first adjusting element 43 to an amplifier feedback output FBO which is connected with the resonance circuit 21 in a feed-forward coupling scheme. The feed-forward coupling scheme allows to in-phase-couple the amplifier feedback output FBO of the amplifier 22 with the oscillator 21 to provide an excitation for the oscillation.

The second gain stage 42 is configured to bring the output of the second gain stage 42 in saturation already with small oscillator signals at its input. So, the second gain stage 42 substantially acts as a comparator where the provided gain substantially depends on the amplitude of the (input) oscillation signal OS.

Furthermore, the output of the second gain stage 42 is coupled via a second adjusting element 44 to the amplifier feedback output FBO. The adjusting elements 43, 44 allow to adjust the impacts of the first and second gain stage 41, 42 on the feedback to the oscillator 21. Preferably, the first and second adjusting elements 43, 44 may be formed by first and second resistors. Therefore, by calibrating the resistances of the first and second resistor, the open loop gain characteristics of the oscillator can be set. Other components as adjusting elements 43, 44 can be used for setting the adjustment alternatively or additionally to the first and second resistor, such as capacitors or inductivities. Furthermore, by setting the gain of the first gain stage 41 by means of the gain control signal GC the open loop gain may be controlled additionally or alternatively.

When the resonance circuit 21 is used as a sensing element for sensing the presence of the conductive object within a sensing range of the sensing coil 211, the oscillation frequency varies over inductance and amplitude varies over the resonant impedance of the resonance circuit 21 of the oscillator 2. By coupling the amplifier feedback output FBO to the resonance circuit 21, an operating point is set where the amplification gain corresponds the open loop gain which is about 1 in a steady state operation, while the oscillation amplitude varies with the quality factor of the oscillator 2.

The output of the first gain stage 41 can be coupled to the amplitude determination unit 31 wherein the amplitude value of the amplified oscillation signal AOS is determined.

Therefore, while using the customized gain characteristics of the amplifier 22 for feedback controlling the oscillation of the oscillator 21, the amplified oscillation signal AOS can be tapped from the amplifier 22 as the output of the first gain stage 41. Alternatively, also the amplifier feedback output FBO or the oscillation signal OS (if not identical) may be used to apply to the amplitude determination unit 31.

If a frequency shall be determined in the frequency determination unit 35, the output of the second gain stage 42 should be used, as it provides the oscillation signal with a high amplitude.

The first and second resistors 43, 44 can be provided as fixed resistances, however at least the first resistor 43 may be implemented with a switching option, e.g. as an active electronic switch by means of an active component such as a MOSFET, to be controlled by the control signal C supplied by control unit 3. The control unit 3 may control the electronic switch by applying a pulse width modulated (PWM) signal with a duty cycle which determines the effective resistance of the electronic switch. Setting the electronic switch can be used to adjust the gain characteristics of the amplifier 22, e.g. to customize the operating point of the amplifier 22.

The invention claimed is:

1. A measurement device including an oscillating sensor device, particularly for a proximity sensor, for sensing a dynamic change of attenuation caused by a measurable physical effect, comprising:
   an oscillator including a resonance circuit and an amplifier fed back to the resonance circuit and configured to maintain oscillation of the oscillator wherein the amplifier comprises a non-linear gain characteristics defining an operating point at a preset amplitude of oscillation, and
   a control unit configured to control an open loop gain of the oscillator, wherein:
      the open loop gain is defined as a gain resulting from a ratio of a voltage amplitude of the oscillation at the resonance circuit and a variable amplitude of an amplifier input for an open loop condition;
      the control unit is configured to control the open loop gain of the oscillator so that the operating point is set to the preset amplitude of the oscillation;
      a dynamic of adapting the open loop gain is lower than a dynamic of change of attenuation due to an object to be detected; and
      the control unit comprises:
         an amplitude determination unit for determining a current amplitude value of the oscillation amplitude and a control deviation unit for determining an amplitude deviation between the preset amplitude and the current amplitude value; and
         an analyzing unit configured to receive the amplitude deviation and derive a sensor signal therefrom.

2. The measurement device according to claim 1, wherein the amplifier has a gain stage which is feedback coupled with the resonance circuit by means of a feedback circuit including a variable resistance to be controlled by a control circuit in order to control the open loop gain of the oscillator, wherein particularly the feedback coupling is provided by a trimming resistor with a fixed resistance and a controllable switch so that an effective variable resistance is set by controlling the switch with a modulated control signal.

3. The measurement device according to claim 1, wherein the amplifier has a gain stage, wherein the control unit is configured to control a gain of the gain stage in order to control the open loop gain of the oscillator, wherein particularly the gain stage is configured as a voltage controlled gain stage to be controlled by a voltage gain control signal provided by the control unit or the gain stage includes an internal feedback to be controlled by a PWM gain control signal provided by the control unit.

4. The measurement device according to claim 1, wherein the control unit comprises a controlling block for implementing a control with an integration portion with at least one integration factor to provide a control signal for controlling the open loop gain of the oscillator.

5. The measurement device according to claim 4, wherein the at least one integration factor comprises a first integration factor.

6. The measurement device according to claim 5, wherein the controlling block of the control unit is configured to provide the integration portion with the first integration factor in case of a positive amplitude deviation between the preset amplitude and a current amplitude of oscillation and with a second integration factor for a negative amplitude deviation, wherein the first integration factor and the second integration factor are different.

7. The measurement device according to claim 5, wherein the control unit is configured to provide a proportional and/or a differential portion for either a positive or a negative amplitude deviation.

8. The measurement device according to claim 1, wherein the control unit is configured to adjust the open loop gain of the oscillator so that the oscillation amplitude corresponds to the preset amplitude after a first time after a positive amplitude deviation larger than a given first amplitude deviation threshold has been detected.

9. The measurement device according to claim 8, wherein the control unit is configured to adjust the open loop gain so that the oscillation amplitude corresponds to the preset amplitude after a second time after a negative amplitude deviation larger than a given second amplitude deviation threshold has been detected, wherein the second time is shorter than the first time and wherein the first amplitude deviation threshold is equal to, higher or lower than the second amplitude deviation threshold.

10. The measurement device according to claim 1, wherein a frequency determination unit is provided and is configured to determine an oscillation frequency shift caused by a dynamic object, wherein the analyzing unit is configured to receive the oscillation frequency and to determine a kind of dynamic object by the amplitude deviation and by the frequency shift determined.

11. A proximity sensor comprising the measurement device according to claim 1 wherein the resonance circuit includes a sensing coil.

12. The measurement device according to claim 2, wherein:
   the control unit is configured to control a gain of the gain stage in order to control the open loop gain of the oscillator; and one of: the gain stage is configured as a voltage controlled gain stage to be controlled by a voltage gain control signal provided by the control unit; or the gain stage includes an internal feedback to be controlled by a PWM gain control signal provided by the control unit.

13. The measurement device according to claim 12, wherein the control unit comprises:
   a controlling block for implementing a control with an integration portion to provide a control signal for controlling the open loop gain of the oscillator.

14. The measurement device according to claim 6, wherein the control unit is configured to provide a proportional and/or a differential portion for either the positive or the negative amplitude deviation.

15. A method for operating a measurement device particularly for a proximity sensor, for sensing a dynamic change of attenuation caused by a measurable physical effect, which comprises:
- providing the measurement device with an oscillator including a resonance circuit and an amplifier fed back to the resonance circuit and configured to maintain oscillation of the oscillator, the amplifier comprising a non-linear gain characteristics defining an operating point at a preset amplitude of oscillation; and
- controlling an open loop gain of the oscillator so that the operating point is set to the preset amplitude of the oscillation, wherein:
  - the open loop gain is defined as a gain resulting from a ratio of a voltage amplitude of the oscillation at the resonance circuit and a variable amplitude of an amplifier input for an open loop condition;
  - a dynamic of adapting the open loop gain is lower than a dynamic of change of attenuation due to an object to be detected;
  - a current amplitude value of the oscillation amplitude is determined and an amplitude deviation is determined between the preset amplitude and the current amplitude value; and
  - the amplitude deviation is received and a sensor signal is derived therefrom.

* * * * *